United States Patent [19]
Yamamura et al.

[11] Patent Number: 5,663,575
[45] Date of Patent: Sep. 2, 1997

[54] LIQUID CRYSTAL DISPLAY DEVICE PROVIDING A HIGH APERTURE RATIO

[75] Inventors: Nobuyuki Yamamura, Suwon; In-sik Jang, Songtan-si, both of Rep. of Korea

[73] Assignee: Samsung Electronics Co., Ltd., Suwon, Rep. of Korea

[21] Appl. No.: 493,000

[22] Filed: Jun. 21, 1995

[30] Foreign Application Priority Data

Jun. 22, 1994 [KR] Rep. of Korea .................. 94-14187
Jul. 9, 1994 [KR] Rep. of Korea .................. 94-16553

[51] Int. Cl.$^6$ .................. H01L 29/04; H01L 31/036
[52] U.S. Cl. .................. 257/59; 257/72; 349/42; 349/142
[58] Field of Search .................. 359/59, 54, 87, 359/67, 89; 257/59, 72

[56] References Cited

U.S. PATENT DOCUMENTS 5,446,562   8/1995   Sato .................................. 359/59

*Primary Examiner*—Minh-Loan Tran
*Attorney, Agent, or Firm*—Cushman Darby & Cushman, IP Group Of Pillsbury Madison & Sutro LLP

[57] ABSTRACT

A liquid crystal display is provided with a high aperture ratio which solves the disadvantages of crossover short and limited viewing angle by using a transparent conductive electrode as a lower electrode of a gate line and a storage capacitor. The transparent conductive electrode has a plurality of sections removed so as to form a ladder or mesh structure. An anodic oxidative metal is deposited on the whole surface of the transparent conductive film after forming a gate electrode, thus making the whole surface of the transparent conductive film anodized. The thin film transistors of the LCD have a uniform surface.

12 Claims, 24 Drawing Sheets

LIQUID CRYSTAL DISPLAY DEVICE PROVIDING A HIGH APERTURE RATIO

BACKGROUND OF THE INVENTION

A. Field of the Invention

The present invention relates to a liquid crystal display with a high aperture ratio and method for forming the same. More particularly, the present invention relates to solving disadvantages of crossover shorting and limited viewing angle by using a transparent conductive electrode as a lower electrode of a gate line and a storage capacitor, and depositing anodic oxidative metal on the whole surface of the transparent conductive film after forming a gate electrode, thus making the whole surface of the transparent conductive film anodized. The invention also relates to solving the disadvantage of rubbing in making a liquid crystal display by making the surface of a device uniform, that is, a thin film transistor.

B. Description of the Prior Art

Conventionally, a cathode ray tube (CRT) has been generally used as a display device. However, in recent times, a flat display such as a liquid crystal display (LCD) and a plasma display panel (PDP) have become popular for such use owing to their lightness, thinness and low power-consumption.

An LCD is a non-emissive matrix display, and is classified into a simple matrix-type or an active matrix-type in which a switching element is arrayed in each pixel.

The simple matrix-type of LCD is slower and thus not suitable for application to an up-to-date information processing system in response speed and screen quality. To solve these disadvantages, the active matrix-type LCD has been proposed.

Active matrix-type LCDs are classified into thin film transistor (TFT)-type LCDs and metal insulator metal (MIM)-type LCDs according to the shapes of the switching elements.

The switching element in an TFT active matrix-type LCD includes a field effect transistor having three terminals, including a source electrode terminal connected to a data line, a gate electrode terminal connected to a timing line and a drain electrode terminal connected to an opposite electrode. The operation of turning ON/OFF is operation by a signal from the timing line applied to the gate electrode terminal which carries out the switching operation.

The display characteristic of the LCD is improved by forming a double light shield layer to gain a high contrast and aperture ratio in the formation process of an LCD of the TFT active matrix type. An example of a technique for producing an LCD of the TFT active matrix type using a double light shield layer is suggested in Korean Patent Application Serial No. 91-15530 filed on Sep. 5, 1991 entitled "LIQUID CRYSTAL DISPLAY AND METHOD FOR FORMING THE SAME," which corresponds to U.S. Pat. No. 5,339,181.

The structure of a conventional LCD of the TFT active matrix type is described below with reference to the accompanying drawings:

Referring to FIGS. 1 and 2, a conventional LCD of the TFT active matrix type includes a rear glass substrate 100, a thin film transistor (TFT) gate electrode G arrayed in a matrix on the rear glass substrate 100 and defining a pixel area, a first electrode 10 of a capacitor, an insulating film 2, a semiconductor film 3, a thin film transistor (TFT) source electrode 5b and a thin film transistor (TFT) display signal electrode 5a, a pixel electrode 4, and a storage capacitor C provided in each pixel area.

A margin of the pixel electrode 4 overlaps the first electrode 10 of the capacitor by a predetermined width which is sufficient for producing a border of the margin of each pixel electrode 4. As a result, a disadvantage of a crack in a pixel electrode pattern due to poor coating of the pixel electrode 4 may be overcome.

In addition, overlapping of each TFT source electrode 5b and the entire width of the first electrode of the capacitor may overcome the poor coating of the TFT source electrode 5b along the margin of each pixel electrode 4.

However, the conventional LCDs including the above-mentioned LCD have a disadvantage in that the aperture ratio is 60 percent, which is maximum, and, generally, the aperture ratio is less than 45 percent when opaque metal is employed as the TFT gate electrode material in a pixel of 100 μm×300 μm, which is a standard pixel area of 9.4 inches measured conventionally.

The problem of the aperture ratio is more serious in the case of an extended gray array (XGA) of 69 μm×207 μm, and it is difficult to obtain an aperture ratio of over 50 percent when the TFT gate electrode is made of the opaque metal.

A low aperture ratio causes an increase of power consumption to obtain the required brightness, as well as a path of light passing through a liquid panel to a predetermined range, thus making the range of viewing angle narrow.

SUMMARY OF THE INVENTION

The present invention overcomes the problems and disadvantages of the prior art by providing a liquid crystal display with a high aperture ratio and method for forming the same.

To achieve the objects of and in accordance with a purpose of the invention, as embodied and broadly described herein, the liquid crystal display with a high aperture ratio of the present invention comprises a gate line and a gate electrode having a plurality of transparent conductive films having a ladder structure in a horizontal direction on a glass substrate. An opaque metal is formed on a part of the plurality of transparent conductive films. A plurality of signal lines formed vertically to the gate line. A thin film transistor element having a source electrode is connected to a signal electrode and a drain electrode connected to a pixel electrode on the gate electrode, and an insulating film is formed to overlap the pixel electrode and an internal part of the gate line of the ladder structure.

In another aspect of the present invention, a method for forming a liquid crystal display with a high aperture ratio comprises steps of depositing a transparent conductive film having a ladder structure as a first electrode of a gate line and a capacitor, which is then patterned by performing photolithography on a glass substrate. An opaque and anodic oxidative metal is deposited on the transparent conductive film and patterned by performing photolithography. An insulating film, a semiconductor film and an ohmic contact film are deposited on the substrate. The semiconductor film and the ohmic contact film are patterned to form an island on the gate line by performing photolithography. A source electrode, a drain electrode and a signal line are deposited as a metal film on the patterned semiconductor film and the ohmic contact film to form the island and patterning. An ohmic contact film is etched using the source electrode and the drain electrode as a mask. A transparent conductive film is deposited on the etched ohmic contact film and patterned to form the pixel electrode, and a passivation film is deposited on the transparent conductive film.

In another aspect of the present invention, a liquid crystal display with a high aperture ratio comprises pixel capacitors and connectors both made of transparent conductive material and extended to a scanning line direction, wherein the pixel capacitors include pixels having a mesh structure. The connectors include a plurality Of scanning electrodes for offering two signal paths in combining adjacent two pixel capacitors, and the pixel capacitors are employed as additional capacitor electrodes.

In another aspect of the present invention, a liquid crystal display with a high aperture ratio comprises pixel capacitors and connectors both made of transparent conductive material and extended to a scanning line direction. The pixel capacitors include pixels having a mesh structure or ladder structure and are employed as additional capacitor electrodes. The connectors comprise a plurality of first scanning electrodes for offering at least two signal paths in combining adjacent the two pixel electrodes. A plurality of second scanning electrodes are made of a material having a higher thermal endurance and lower resistance than those of the material of the first scanning electrodes, and are formed selectively on a plurality of first scanning electrodes and positioned in a part of connectors of the first scanning electrodes and the adjacent pixel capacitors thereof. A plurality of data electrodes are formed on the first and the second scanning electrodes, and insulating layers having predetermined thickness are respectively formed therebetween, and are extended in a vertical direction to an advance direction of the first scanning electrodes. A plurality of pixel electrodes formed on the pixel capacitors of the first scanning electrodes and the insulating layers having predetermined thickness are formed therebetween. A plurality of transistors including each source electrode are connected to each corresponding pixel electrode, with each drain electrode connected to each corresponding data electrode, and a gate made of the first and the second scanning electrodes.

In another aspect of the present invention, a liquid crystal display with a high aperture ratio comprises a plurality of scanning electrodes extended in each scanning line direction, and a plurality of pixel capacitors extended in each scanning line direction, electrically insulated, formed by the transparent conductive material, and formed on each pixel as a mesh or ladder structure.

Additional objects and advantages of the invention will be set forth in part in the description which follows, and will be clear from the description. The objects and advantages of the invention will be realized and attained by means of the elements and combinations particularly pointed out in the appended claims.

BRIEF DESCRIPTION OF THE DRAWINGS

The accompanying drawings illustrate embodiments of the invention and, together with the description, serve to explain the principles of the invention. In the drawings.

DESCRIPTION OF THE PREFERRED EMBODIMENTS

Figure 1:
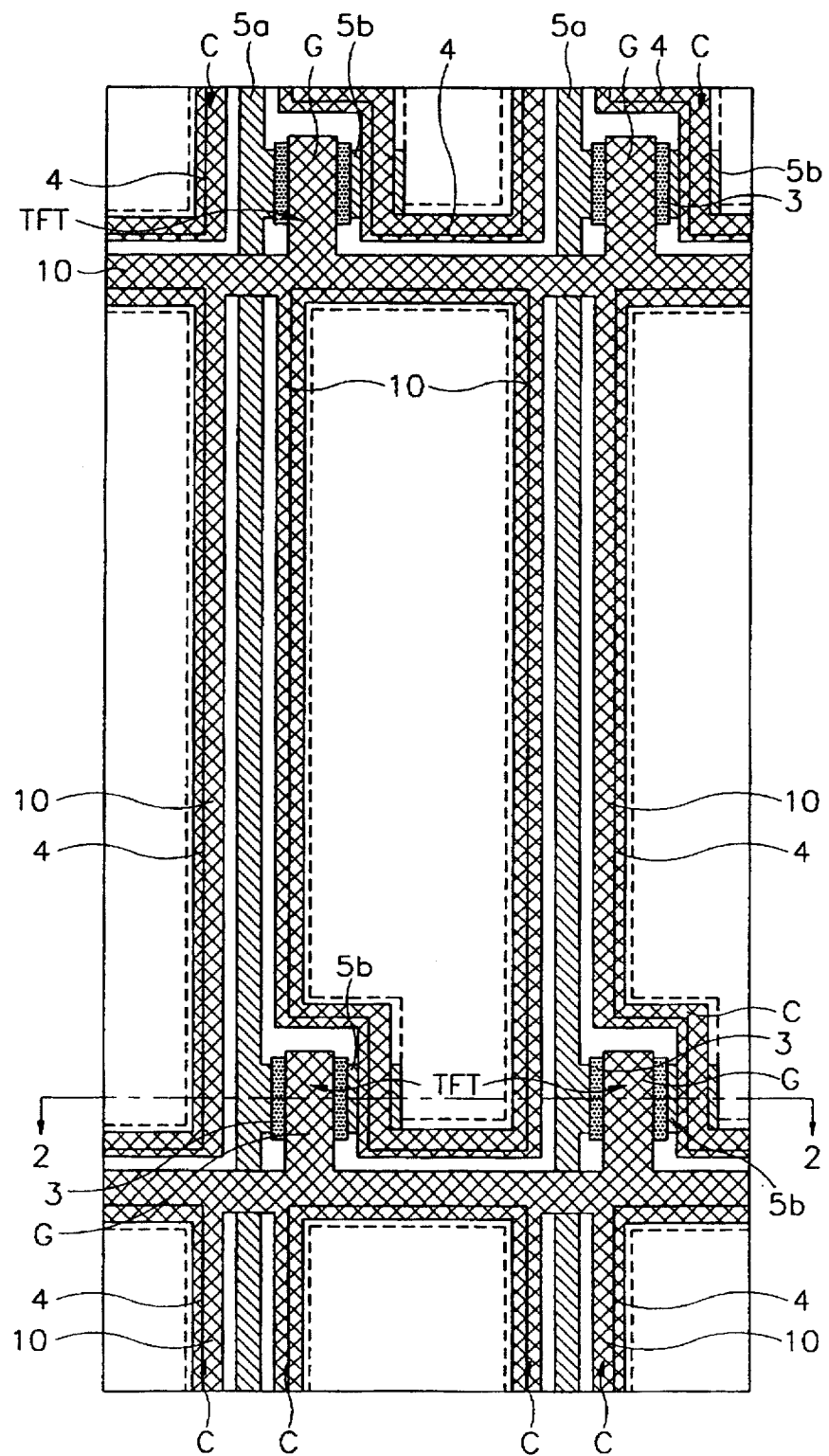
FIG. 1 is a plan view illustrating a conventional liquid crystal display of a thin film transistor active matrix array shown from rear side of a glass substrate.
Figure 2:
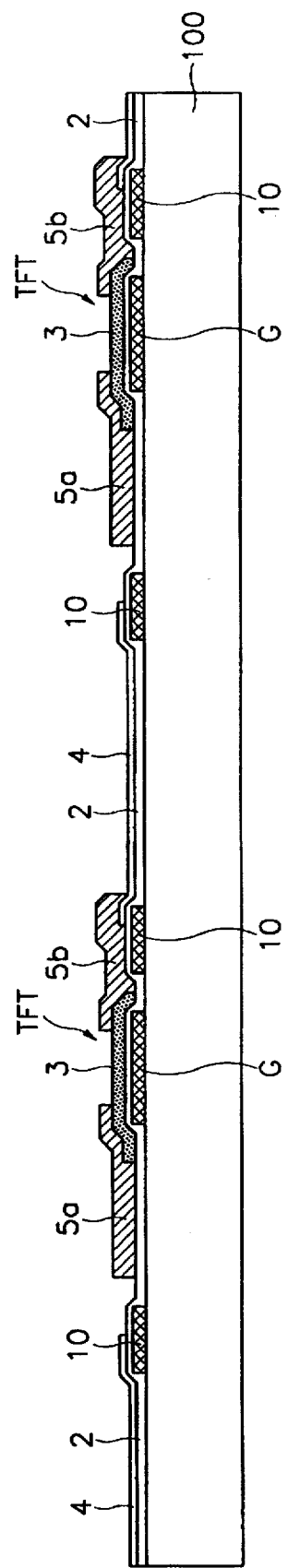
FIG. 2 is a partial section view along the 2—2 line of FIG. 1.
Figure 3:
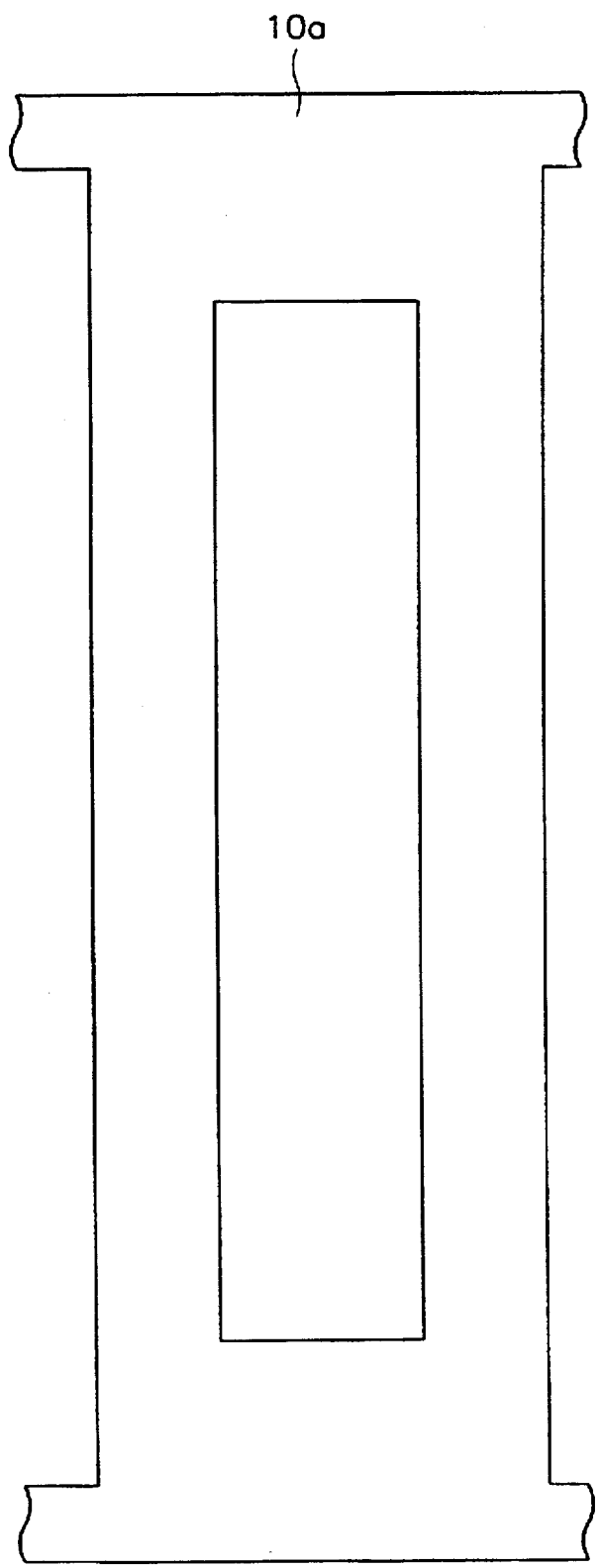
FIGS. 3 to 8 are plan views illustrating a process for forming a liquid crystal display with a high aperture ratio according to a first preferred embodiment of the present invention.
Figure 4:
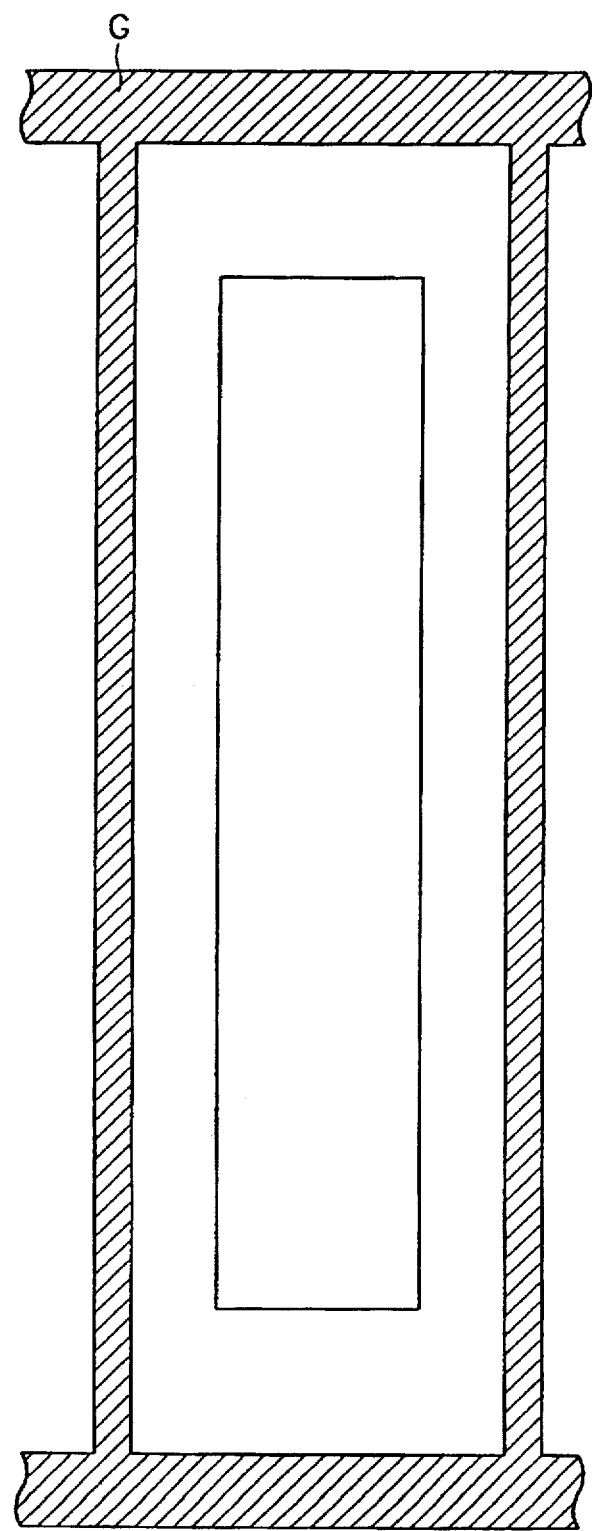
Figure 5:
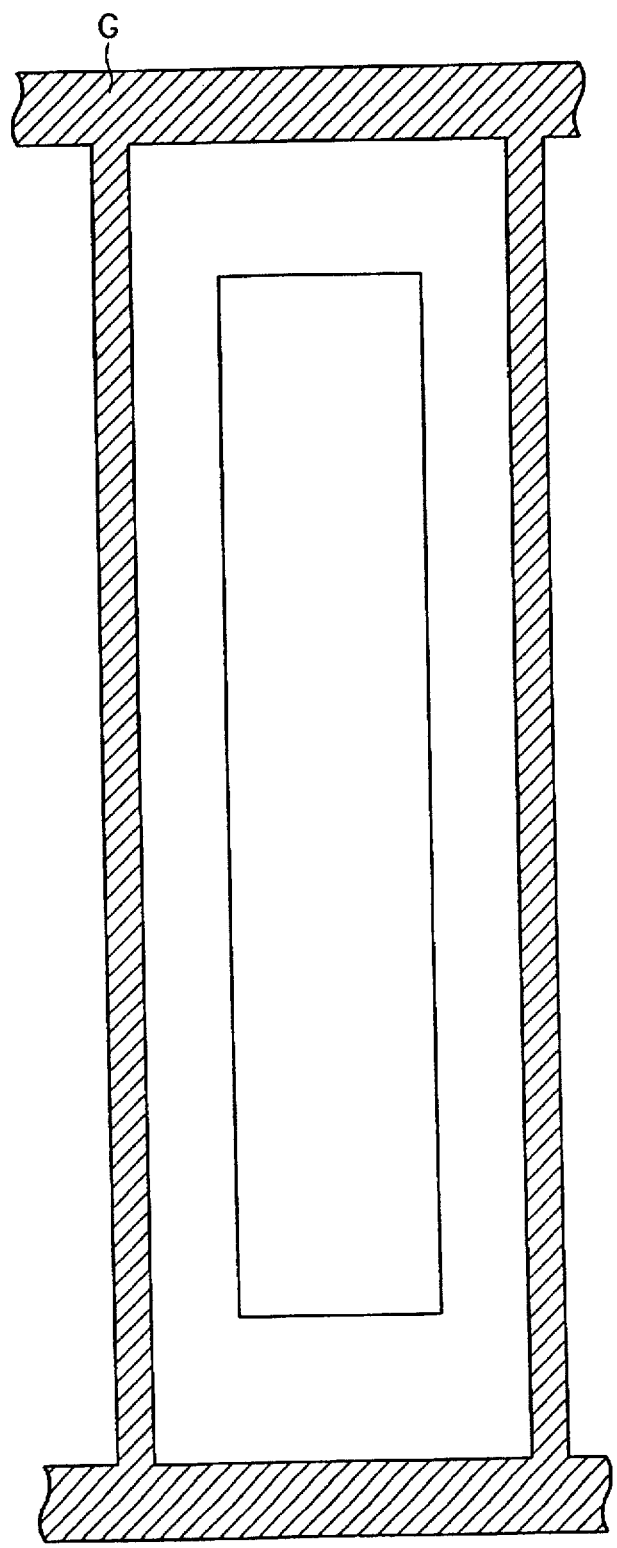
Figure 6:
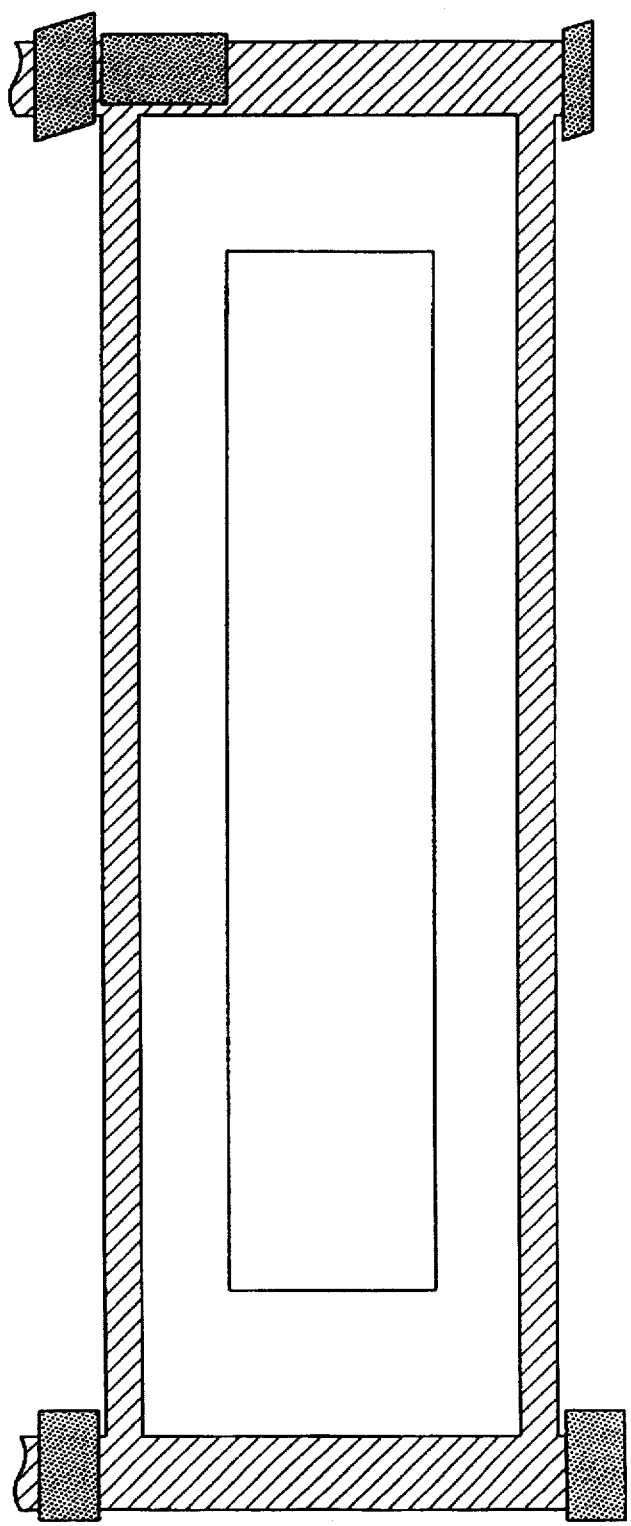

Reference will now be made in detail to preferred embodiments of the present invention, examples of which are illustrated in the accompanying drawings. Wherever possible, the same reference numbers will be used throughout the drawings to refer to the same or like parts.

Referring to FIGS. 3 to 8, a transparent conductive film of indium tin oxide (ITO) having a ladder structure is deposited on a rear glass substrate as a first electrode 10a of a gate line, an auxiliary gate line and a capacitor, and is patterned by using photolithography.

Referring to FIGS. 4 to 9, gate metal G, which is anodized, such as molybdenum-tantalum, tantalum or aluminum, is deposited and patterned. The whole surface of the gate metal G is anodized, and thus an anodic oxide film 2a is formed on the gate metal G. The gate metal G has low resistance, which the transparent conductive film ITO 10a does not have, and plays the role of a black matrix which blocks ambient light around a lower part of a pixel electrode 4a, resulting in a high aperture ratio.

Referring to FIGS. 5 to 9, three films, that is, a nitride silicon film SiNx as an insulating film 2b, an a-Si film as a semiconductor film 3a and n$^+$-Si film as an ohmic contact film 3b, are sequentially deposited.

Referring to FIGS. 6 to 9, the semiconductor film (a-Si film) 3a and the ohmic contact film (n⁺-Si film) 3b are patterned like an island on a crossover part of a gate line G and a display signal line 5a' using photolithography.

Figure 7:
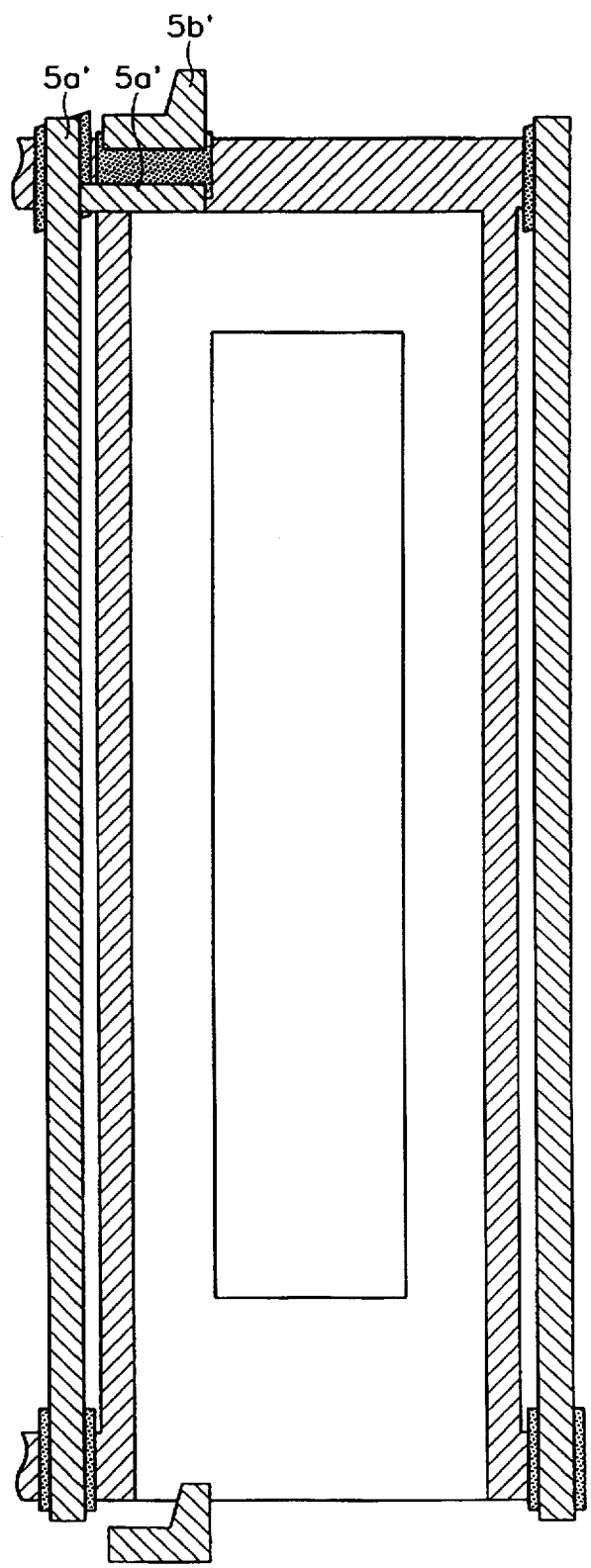
Figure 8:
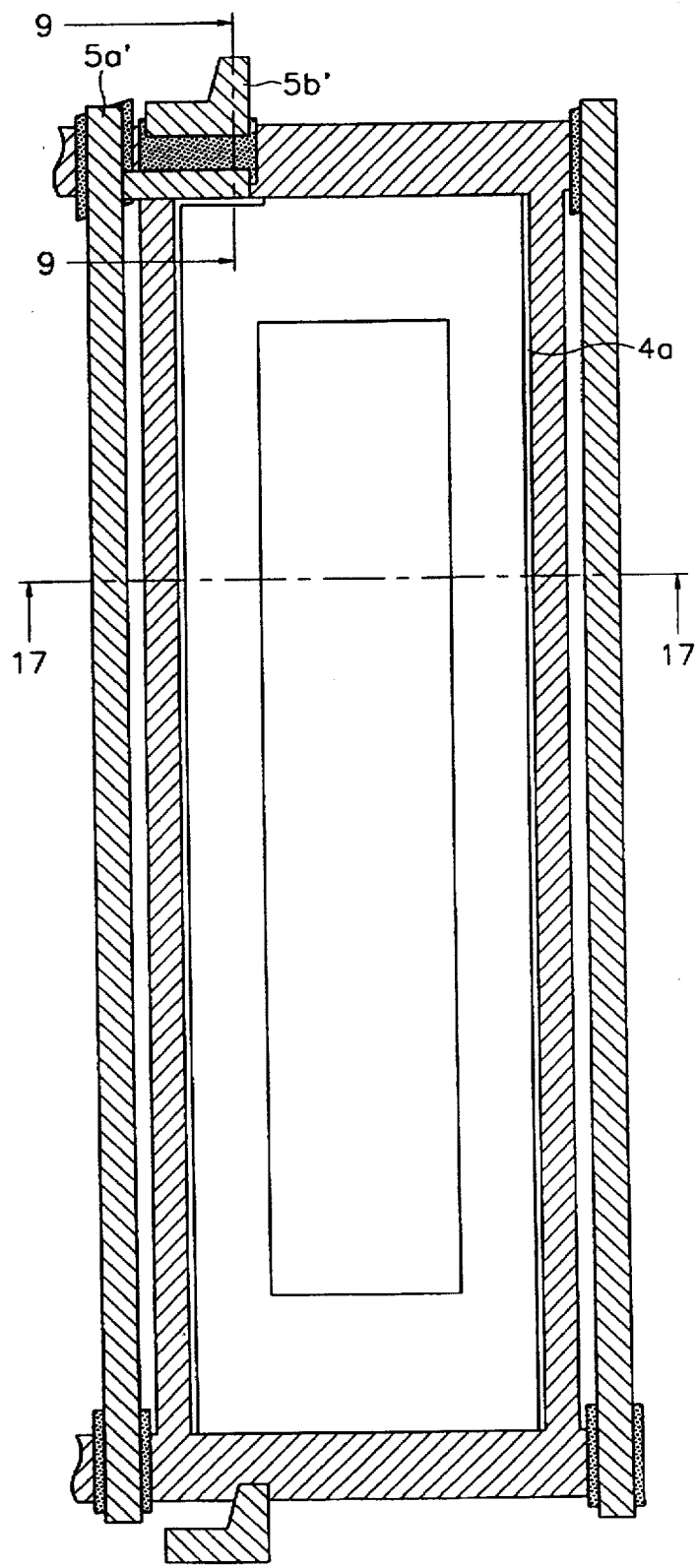
Figure 9:
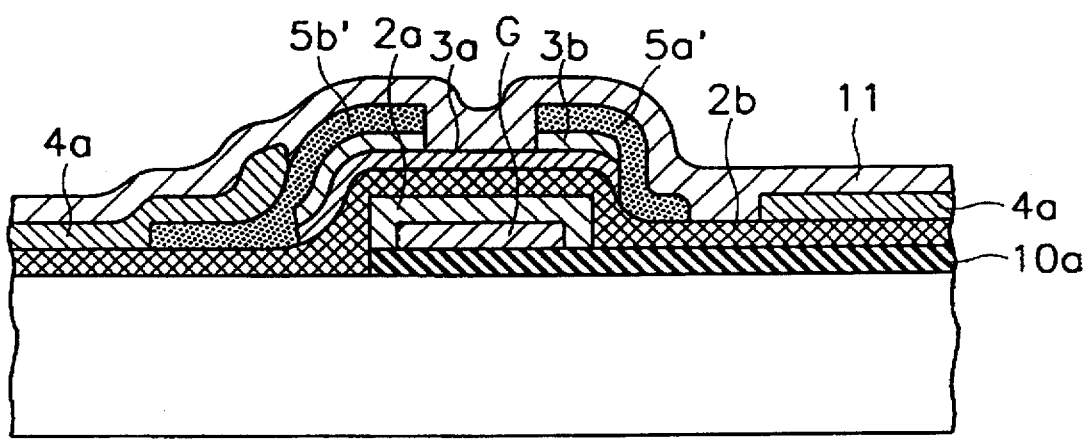
FIG. 9 is a sectional view along line 9—9 of FIG. 8.
Figure 10:
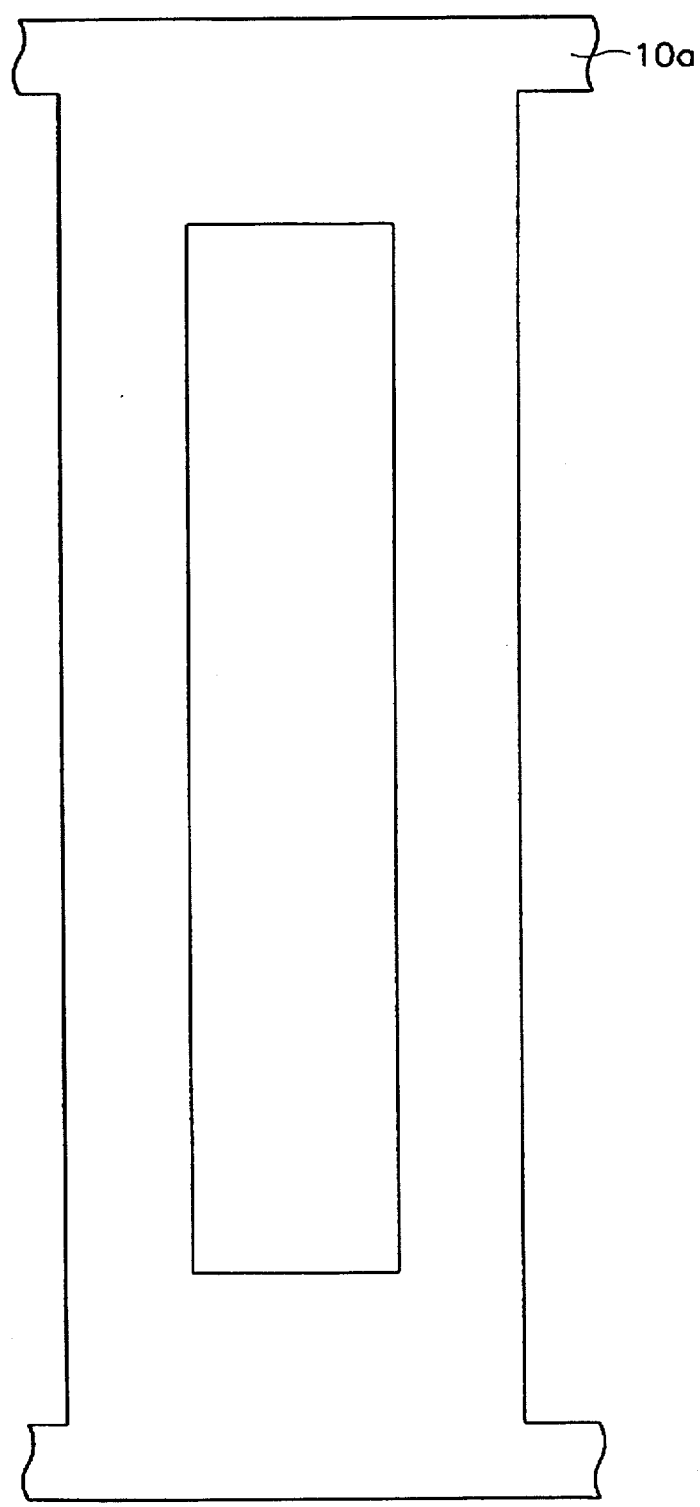
FIGS. 10 to 15 are plan views illustrating a process for forming a liquid crystal display with a high aperture ratio according to a second preferred embodiment of the present invention.

Referring to FIGS. 7 to 9, source electrode metal 5a' and drain electrode metal 5b' are deposited and patterned, and the ohmic contact film (n⁺-Si film) 3b in the upper part of an active film (a-Si film) 3a between the source electrode metal 5a' and the drain electrode metal 5b' is etched using the source electrode metal 5a' and the drain electrode metal 5b' as a mask.

Referring to FIGS. 8 to 9, a pixel electrode (ITO) 4a is deposited and patterned. A passivation film 11 is deposited as the nitride silicon film.

A transparent conductive film 10a is used as a gate line, and concurrently as a lower electrode of a storage capacitor formed by depositing an insulating film 2b between the transparent conductive film 10a and the pixel electrode (ITO) 4a.

Figure 17:
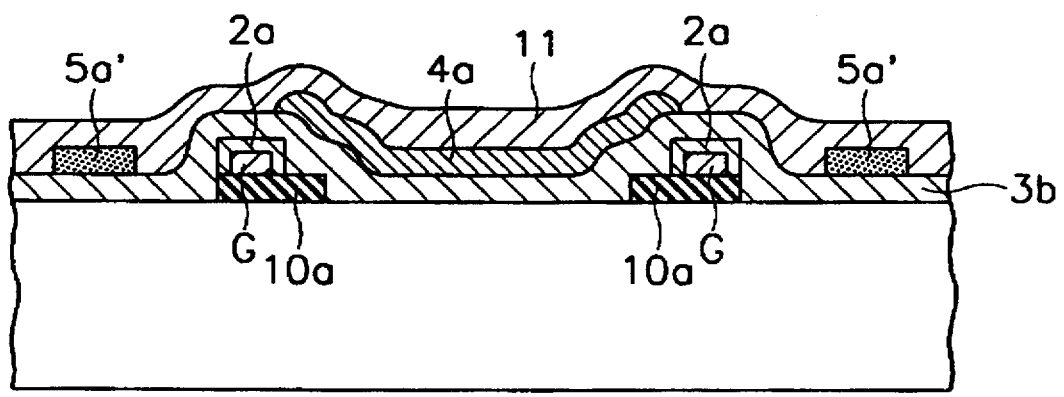
FIG. 17 is a sectional view along the 17—17 line of FIGS. 8 and 15.

Referring to FIG. 17, the aperture ratio may be improved by using the transparent conductive film (ITO) 10a as the lower electrode of the gate line and the storage capacitor in a thin film transistor according to a first preferred embodiment of the present invention.

The process for forming a liquid crystal display with a high aperture ratio according to a second preferred embodiment of the present invention is similar to that of a liquid crystal display with a high aperture ratio according to the first preferred embodiment of the present invention. The formation process will be explained with reference to the accompanying drawings as follows:

Referring to FIGS. 10 to 16, a transparent conductive film ITO having a ladder constitution is deposited on a glass substrate as a first electrode 10a of a gate line, an auxiliary gate line and a capacitor, and patterned by using photolithography.

Figure 11:
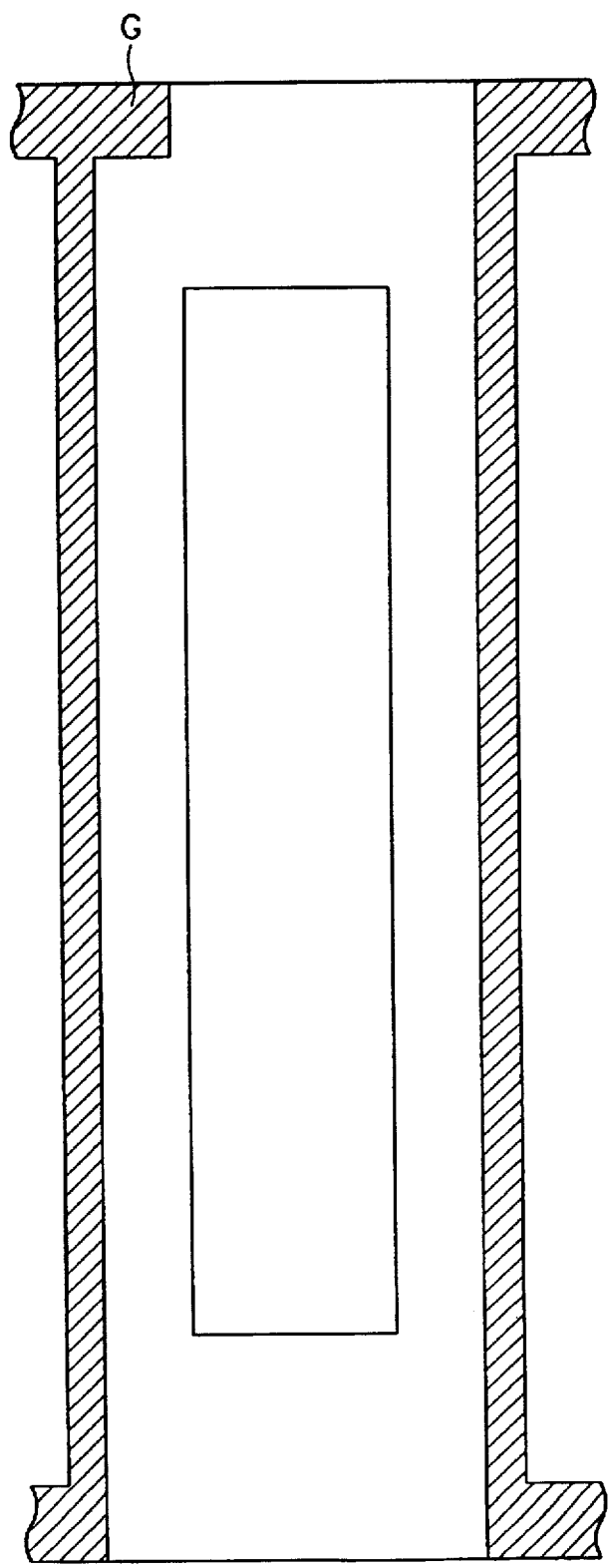
Figure 12:
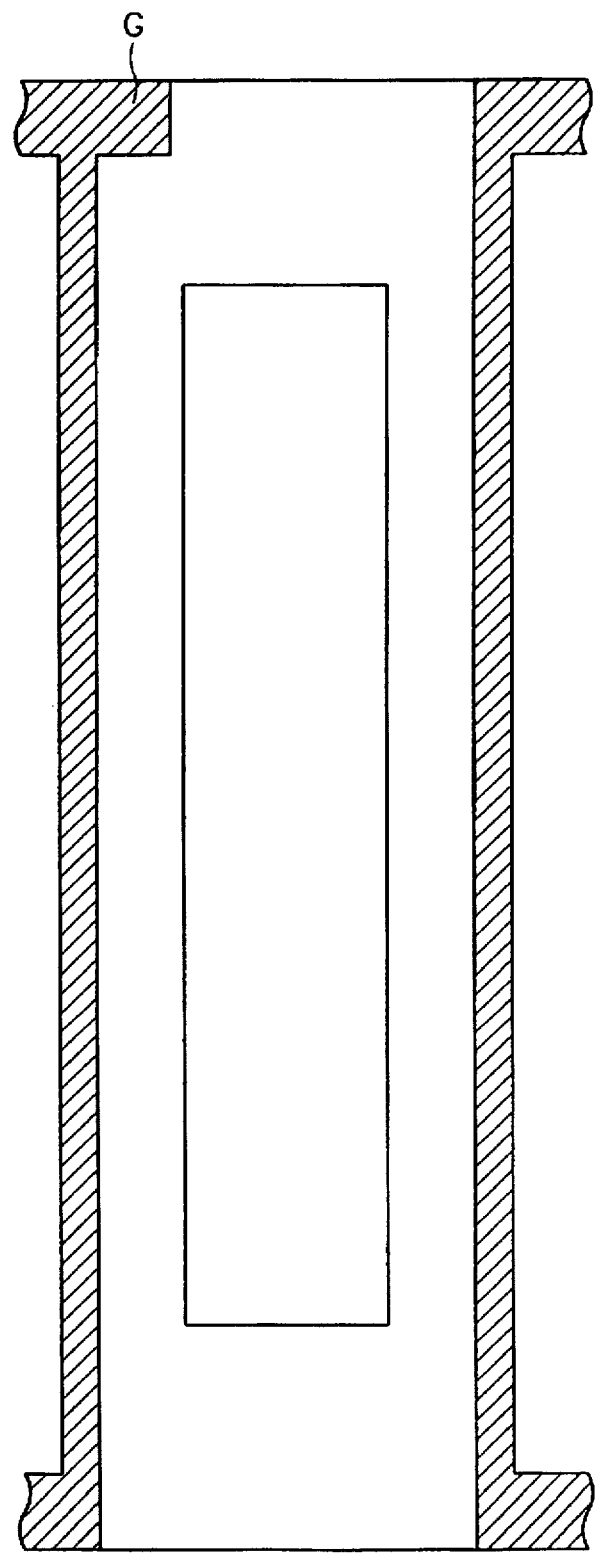
Figure 13:
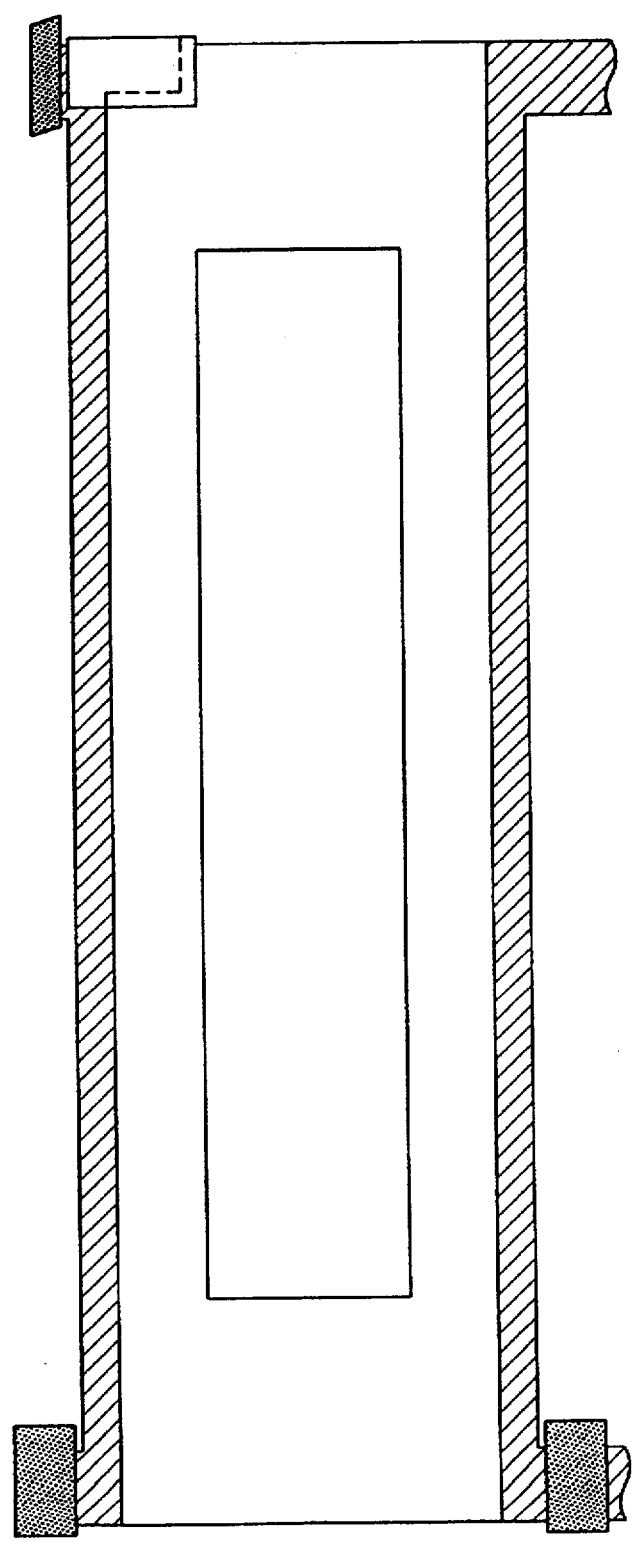

Referring to FIG. 11, gate metal G which is anodized, such as molybdenum-tantalum, tantalum or aluminum, is deposited and patterned. The whole surface of the gate metal G is anodized, and thus an anodic oxide film 2a is formed on the gate metal G.

Referring to FIGS. 12 to 16, three films, that is, a nitride silicon film SiNx as an insulating film 2b, an a-Si film as a semiconductor film 3a and n⁺-Si film as an ohmic contact film 3b, are sequentially deposited.

Referring to FIGS. 13 to 16, the semiconductor film (a-Si film) 3a and the ohmic contact film (n⁺-Si film) 3b are patterned like an island on a crossover part of a gate line G and a display signal line 5a' using photolithography.

Figure 14:
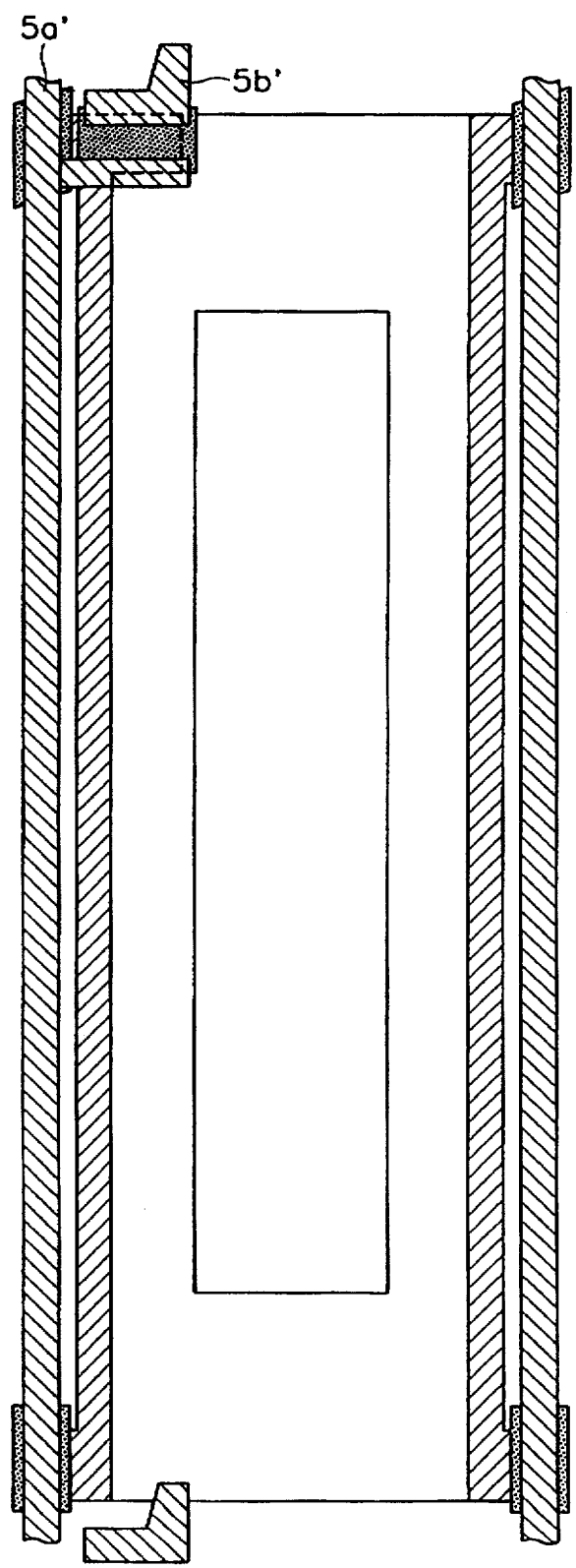
Figure 15:
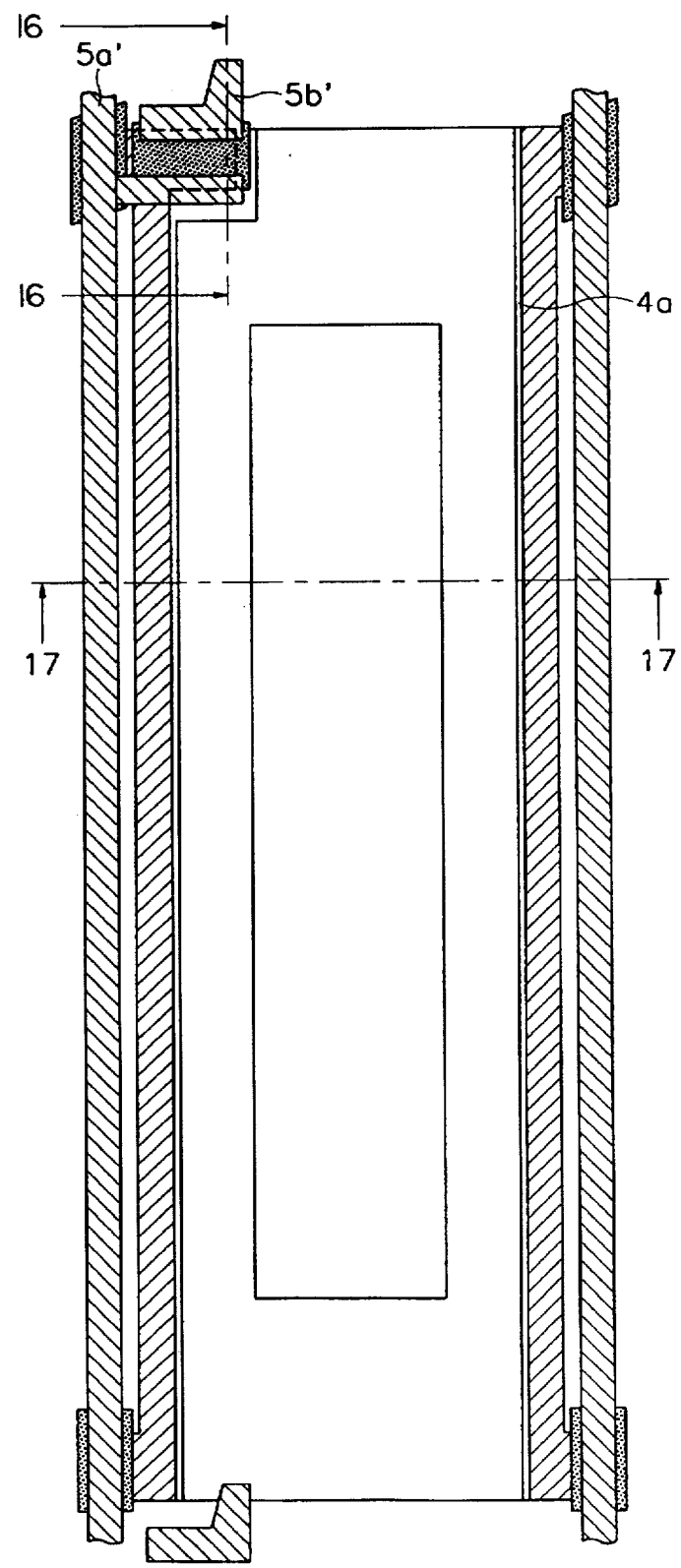
Figure 16:
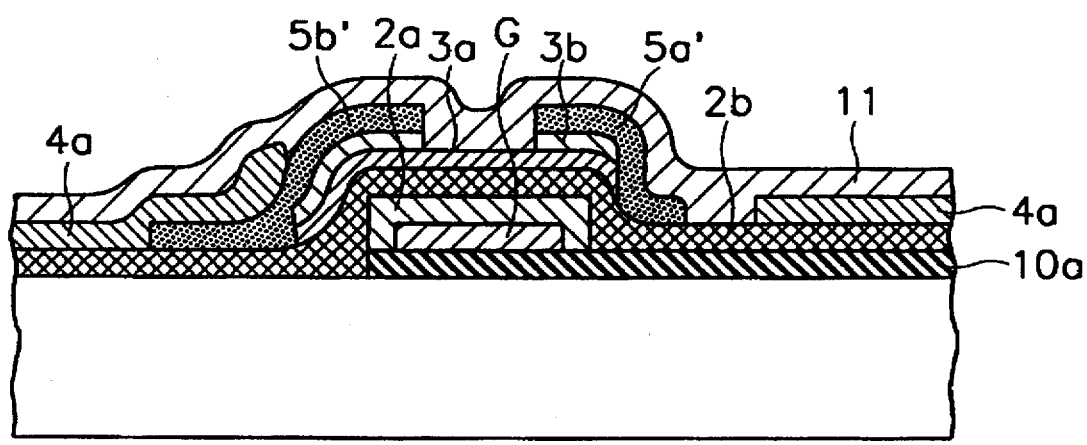
FIG. 16 is a sectional view along the 16—16 line of FIG. 15.

Referring to FIGS. 14 to 16, source electrode metal 5a' and drain electrode metal 5b' are deposited and patterned, and the ohmic contact film (n⁺-Si film) 3b in the upper part of an active film (a-Si film) 3a between the source electrode metal 5a' and the drain electrode metal 5b' is etched using the source electrode metal 5a' and the drain electrode metal 5b' as a mask.

Referring to FIGS. 15 to 16, the pixel electrode (ITO) 4a is deposited and patterned. A passivation film 11 is deposited as the nitride silicon film SiNx.

The transparent conductive film is used as a gate line as in the first preferred embodiment of the present invention, and concurrently as a lower electrode of a storage capacitor formed by depositing an insulating film between the transparent conductive film and the pixel electrode ITO. In addition, since the gate line is formed as a double film of transparent conductive film and metal, the disadvantage of broken gate lines can be solved.

Referring to FIG. 17, the aperture ratio may be improved since the lower electrode of the gate line and the storage capacitor in a thin film transistor is formed only by the transparent conductive film ITO according to a first and second preferred embodiment of the present invention.

Figure 18:
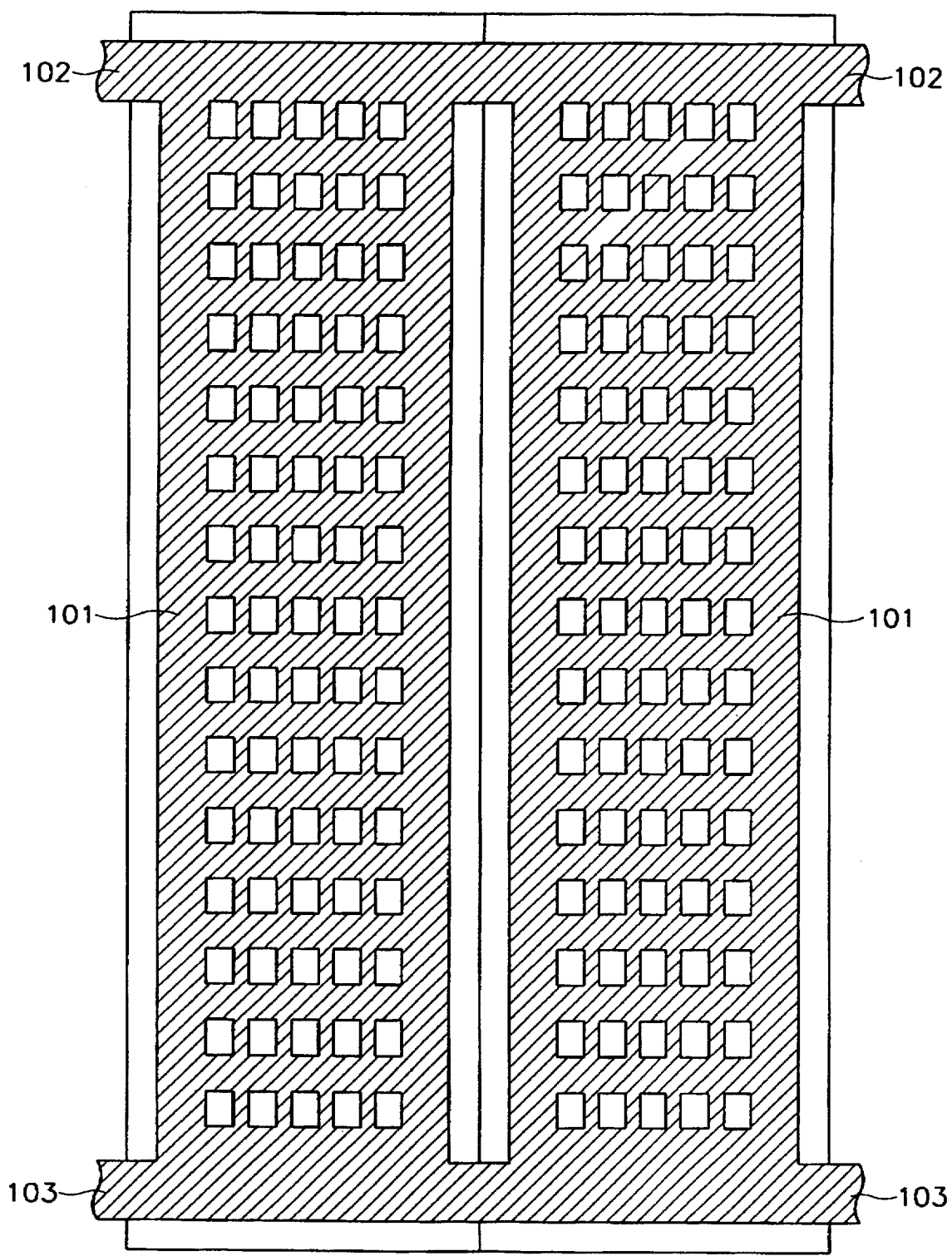
FIG. 18 is a view illustrating a first construction of a scanning electrode in an additional capacitance type liquid crystal display according to a third preferred embodiment of the present invention.

The construction of a scanning electrode in an additional capacitance type liquid crystal display according to a third preferred embodiment of the present invention will be explained with reference to the accompanying drawings as follows:

Referring to FIG. 18, the scanning electrode includes a plurality of pixel capacitors 101 formed from transparent conductive material and a plurality of connectors 102 and 103.

The pixel capacitors 101 have a mesh-structure to control tilt, formed wholly over a corresponding pixel and formed of transparent conductive material such as indium tin oxide.

The connectors 102 and 103 are for connecting adjacent pixel capacitors 101 to each other and offer at least two signal paths. That is, two or more connectors 102 and 103 are formed between the pixel capacitors 101.

It is preferable to form selectively an opaque melting layer a metal film of a high melting point on the upper part of the transparent scanning electrode.

Figure 19:
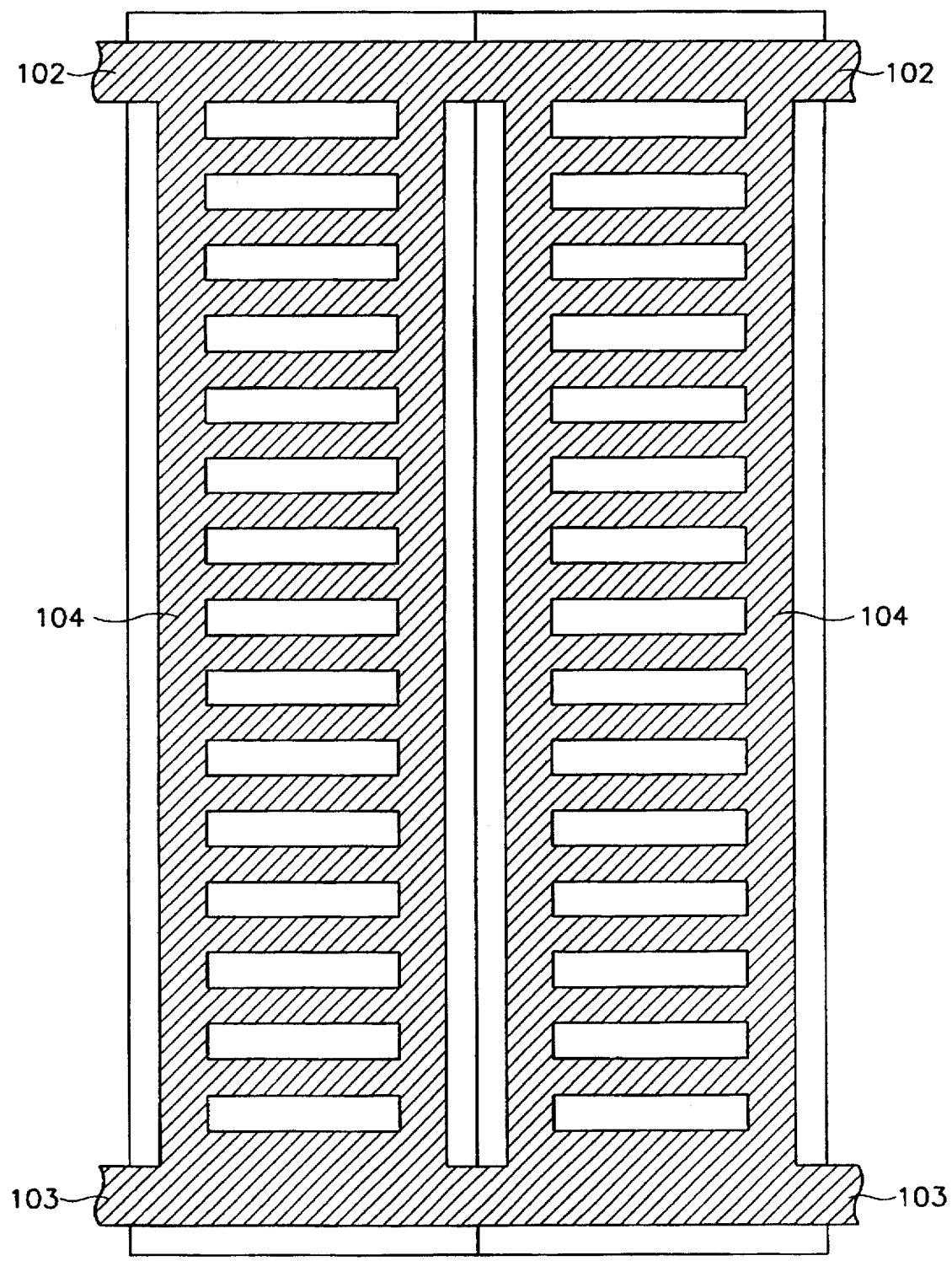
FIG. 19 is a view illustrating a second construction of the scanning electrode in the additional capacitance type liquid crystal display according to the third preferred embodiment of the present invention.

Referring to FIG. 19, the transparent conductive electrodes forming the pixel capacitors 104 have a ladder structure unlike those of FIG. 18. Also, it is preferable to form selectively a metal film of a high meting point on the upper part of the transparent scanning electrode.

Figure 20:
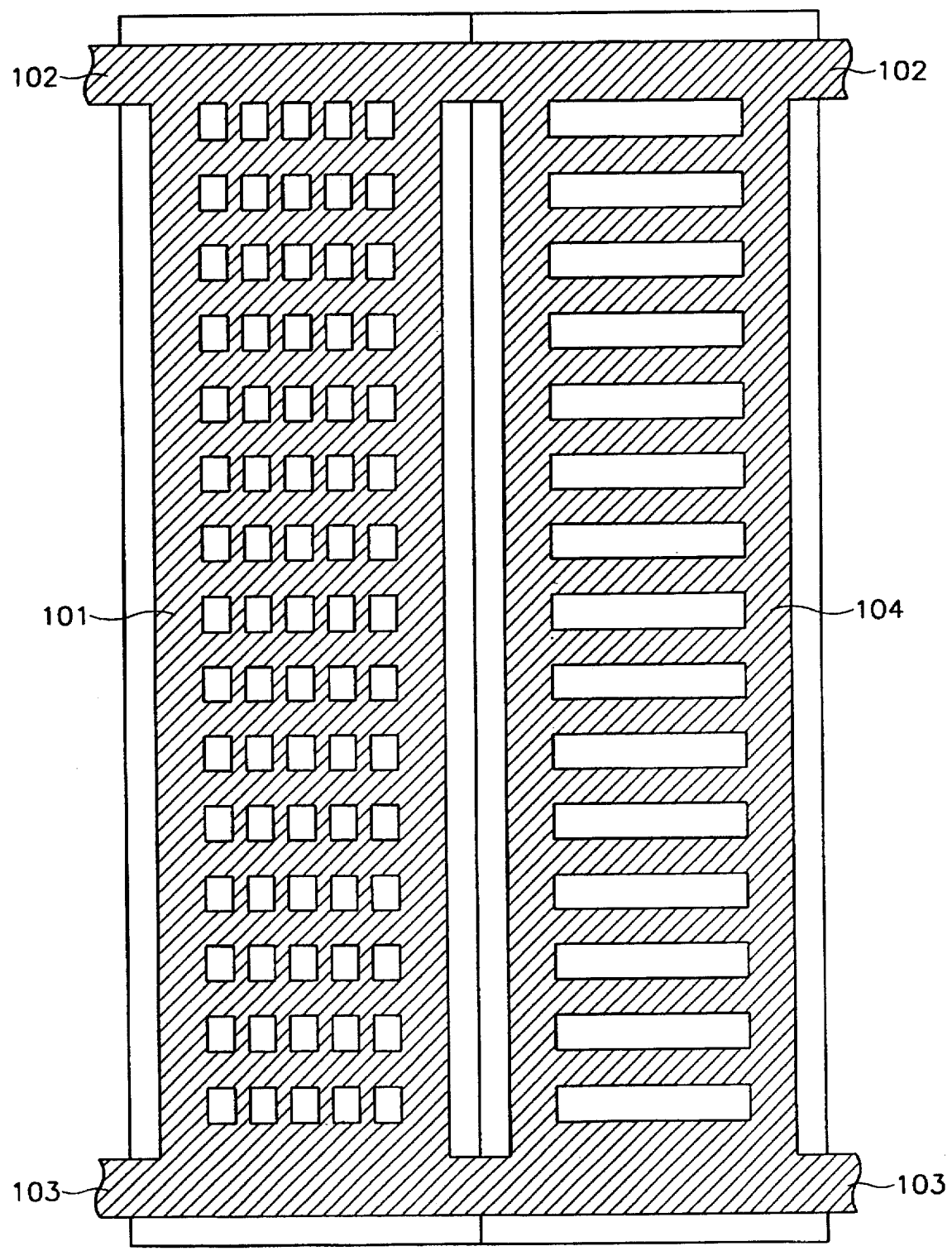
FIG. 20 is a view illustrating a third construction of the scanning electrode in the additional capacitance type liquid crystal display according to the third preferred embodiment of the present invention.

Referring to FIG. 20, the transparent conductive electrodes forming the pixel capacitors 101 and 104 selectively have a mesh structure or a ladder structure.

Figure 21:
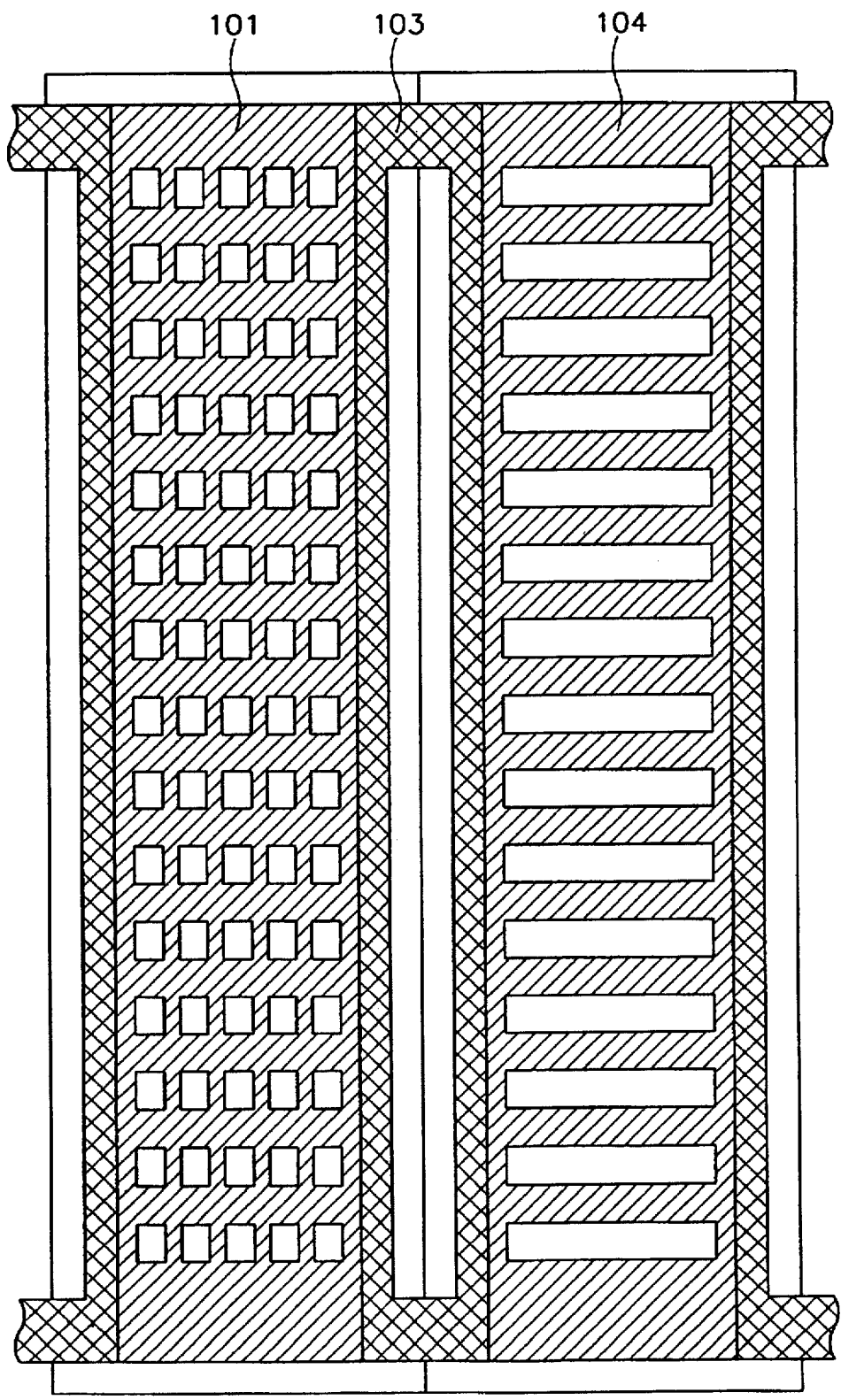
FIG. 21 is a view illustrating a fourth construction of the scanning electrode in the additional capacitance type liquid crystal display according to the third preferred embodiment of the present invention.

Referring to FIG. 21, the scanning electrode includes pixel capacitors and connectors. The transparent conductive electrodes forming the pixel capacitors 101 and 104 selectively have a mesh structure or a ladder structure. In addition, a metal film of high melting point is formed selectively on the pixel capacitors and the connectors to prevent deterioration of screen quality due to gate signal delay, that is, to lower resistance. Generally, since the metal film having a high melting point is opaque, it is preferable to form the metal film having the high melting point selectively on a margin of the pixel capacitors and on upper parts of the connectors, to prevent a low aperture ratio.

Figure 22:
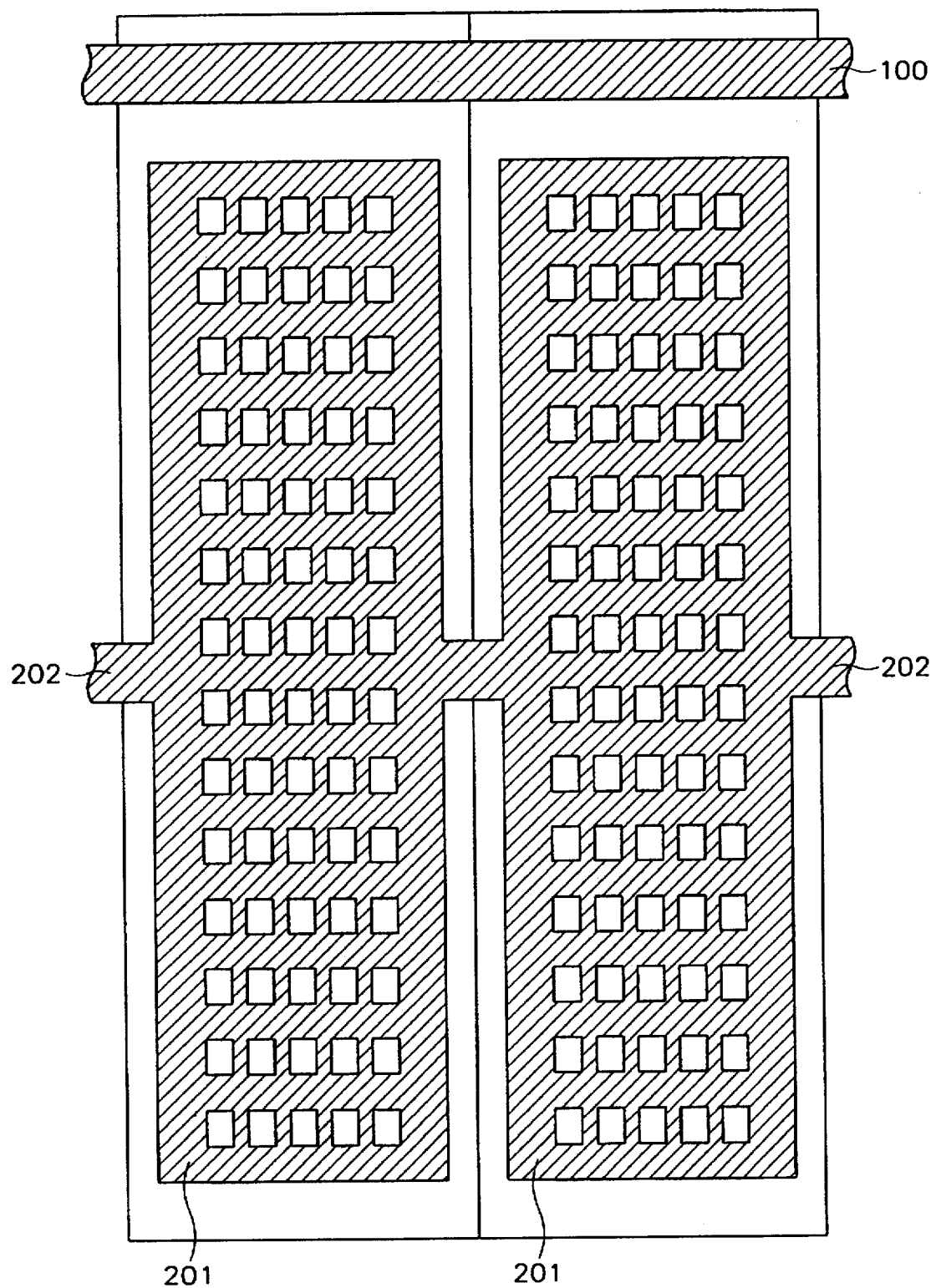
FIG. 22 is a view illustrating a first construction of a scanning electrode in a storage capacitance type liquid crystal display according to a fourth preferred embodiment of the present invention.

The construction of a scanning electrode in a storage capacitance type liquid crystal display according to a fourth preferred embodiment of the present invention will be explained with reference to the accompanying drawings as follows:

Referring to FIG. 22, a scanning electrode 100 employed as a gate electrode of a transistor is extended in a scanning line direction, and a storage capacitance electrode includes a plurality of pixel capacitors 201 and a plurality of connectors 202.

The storage capacitance electrode is formed by the transparent conductive material such as indium tin oxide (ITO) to increase the aperture ratio.

Figure 23:
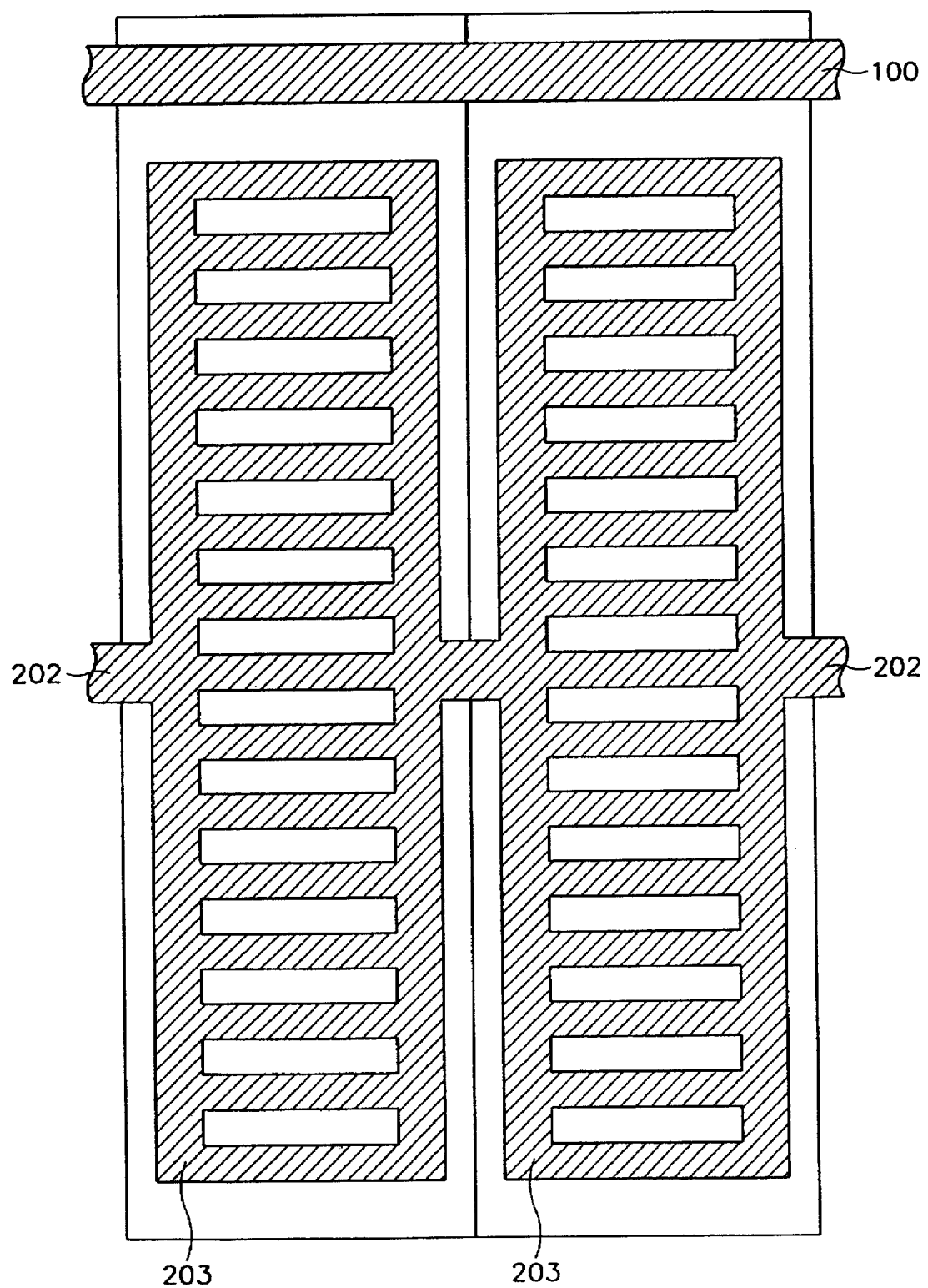
FIG. 23 is a view illustrating a second construction of the scanning electrode in the storage capacitance type liquid crystal display according to the fourth preferred embodiment of the present invention.

Referring to FIG. 23, the pixel capacitors 203 in the storage capacitance electrode have a ladder structure.

Figure 24:
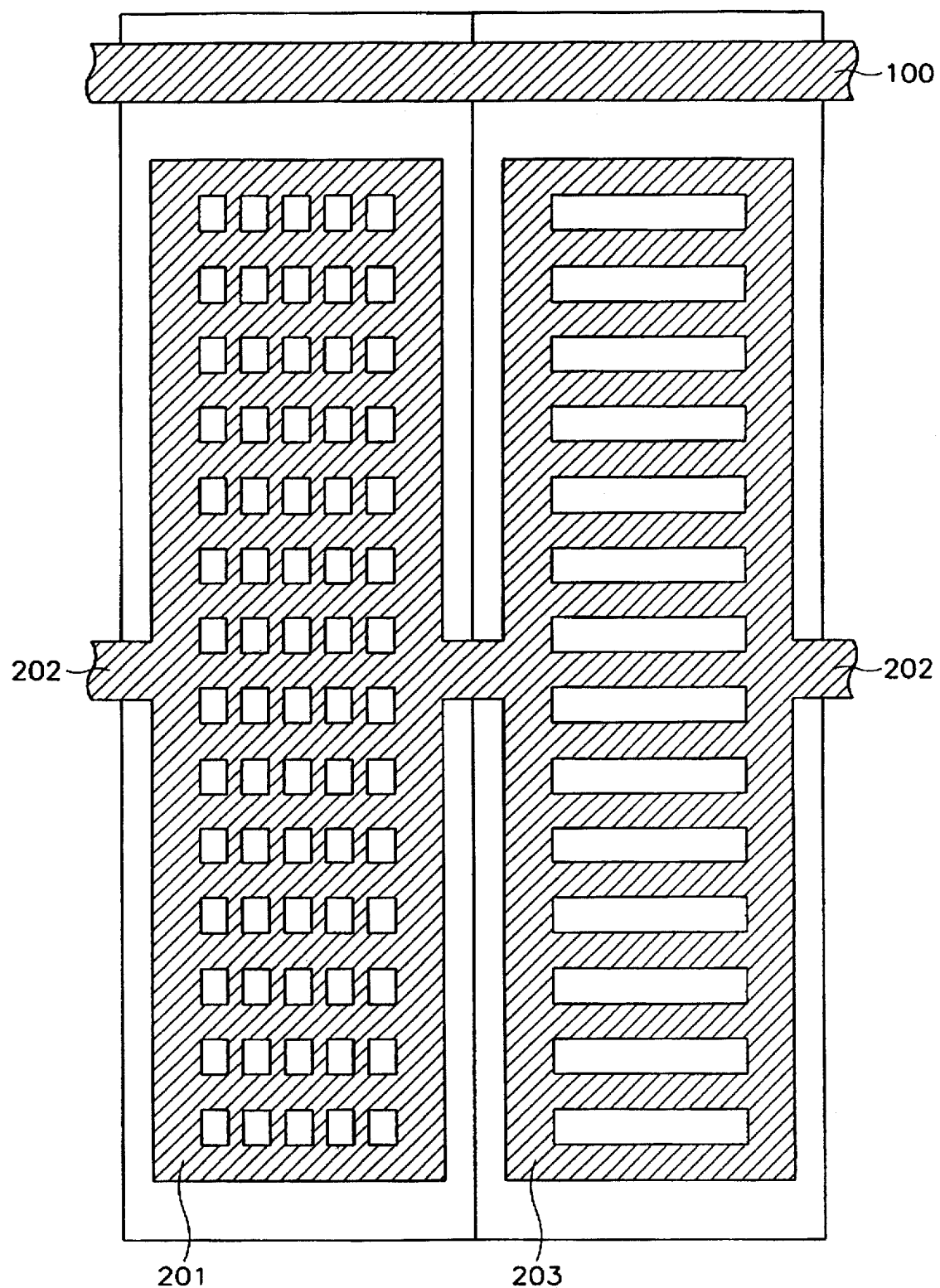
FIG. 24 is a view illustrating a third construction of the scanning electrode in the storage capacitance type liquid crystal display according to the fourth preferred embodiment of the present invention.
Figure 25:
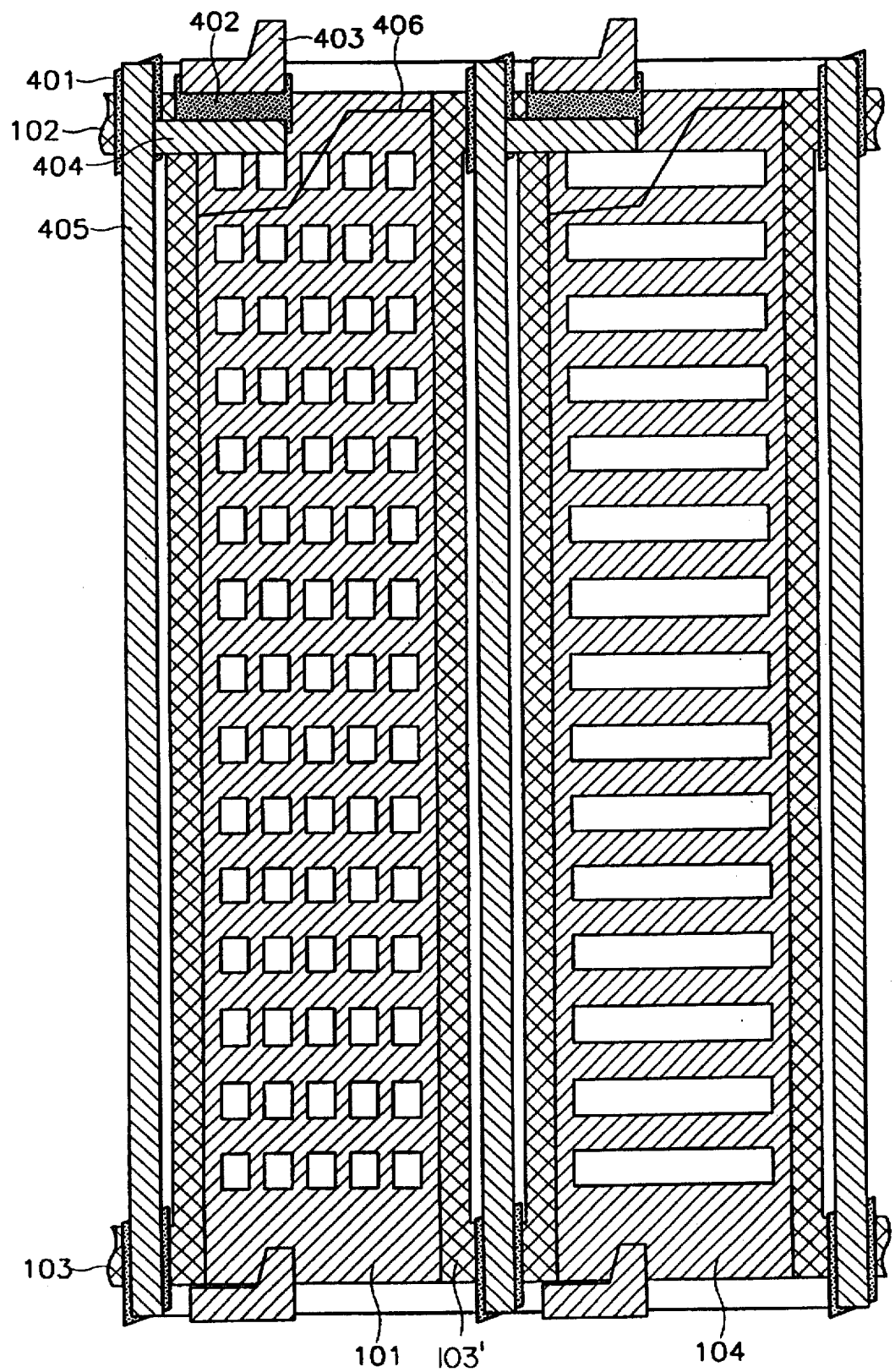
FIG. 25 is a plan view illustrating a liquid crystal display according to a fifth preferred embodiment of the present invention.

Referring to FIG. 24, the pixel capacitors 203 in the storage capacitance electrode have one selected by previously set design between the mesh structure and the ladder structure.

Referring to FIGS. 22 to 26, the scanning electrode 100 is formed preferably as a multilayer structure of ITO and a metal film of a high melting point to prevent deterioration of the screen quality due to gate signal delay. In this case, after the ITO film of the scanning electrode 100 is formed in the same step of forming the storage capacitance electrode, a metal film of the high melting point, such as chrome, wolfram or tantalum, is deposited on the ITO film, and patterned.

The formation process for a liquid crystal display according to a fifth preferred embodiment of the present invention will be explained with reference to the accompanying drawings as follows:

An ITO film having a thickness of 500 to 2000 angstroms is deposited on the scanning electrode 100, and patterned, resulting in the pixel capacitors and connectors having a mesh structure and a ladder structure.

The tilt of the ITO electrode may be controlled by a stepped construction of the ITO electrode having a mesh structure and ladder structure, and scattering by the liquid crystals is improved, enlarging the range of the viewing angle.

A metal film of a high melting point, such as chrome, wolfram or tantalum, is deposited on the ITO film and patterned. At this time, a metal film of high melting point is patterned to be positioned on the margins of the pixel capacitors and on the upper parts of the connectors.

A silicon nitride (SiNx) film as the insulating film is formed on the whole surface of the ITO film. Next, an amorphous silicon film and an $N^+$ silicon film are subsequently formed and patterned to form an active area 402 and an insulating film 401 for fabricating the transistor. The active area 402 is a part in which source/drain areas and a channel area of the transistor are formed. The insulating film 401 is provided for preventing the flow of electricity, and is formed on the upper parts 102 and 103 among the scanning electrodes.

Next, the ITO film is deposited and patterned to form pixel electrodes 406.

A metal film, such as chrome, titanium, aluminum/chrome or aluminum/titanium, is deposited and patterned to produce a source electrode 403 and a data electrode 405. The data electrode 405 is extended in an advanced direction and a vertical direction of the scanning electrode and includes a projection for producing a drain electrode 404. The source electrode 403 is united to the pixel electrodes 406.

The $n^+$ silicon film on the upper part of the channel of the transistor is dry-etched, using the source/drain electrodes and the data electrode as a mask, after forming the source/drain electrodes and the data electrode.

Next, the nitride silicon (SiNx) film as a passivation film is deposited on the whole surface of the electrodes.

As described above, in the preferred embodiments of the present invention, a liquid crystal display is provided with a high aperture ratio and method for forming the same can solve a disadvantage of crossover short by using a transparent conductive electrode as a lower electrode of a gate line and a storage capacitor, and by depositing anodic oxidative metal on the whole surface of the transparent conductive film after forming a gate electrode, thus making the whole surface of the transparent conductive film anodized. Another disadvantage of rubbing in making a liquid crystal display is solved by making the surface of a device, that is, a thin film transistor, uniform.

In addition, the scanning electrode of the additional capacitance type LCD includes the pixel capacitors having the mesh structure or the ladder structure, and the storage capacitance electrode of the storage capacitance type LCD includes the pixel capacitors having the mesh structure or the ladder structure in the preferred embodiments of the present invention. These pixel capacitors increase the scattering effect by liquid crystal, making the range of the viewing angle enlarged.

Other embodiments of the invention will be apparent to those skilled in the art from consideration of the specification and by practice of the invention disclosed herein. It is intended that the specification and examples be considered as exemplary only, with the true scope and spirit of the invention being indicated by the following claims.

What is claimed is:

1. A liquid crystal display device having a high aperture ratio, comprising:

a glass substrate;

a signal line formed on said glass substrate;

a gate line formed on said glass substrate, said gate line being a rectangular band shaped layer having a rectangular section removed, being adjacent to said signal line, and being made of a transparent conductive material;

a first opaque metal layer formed on edges of two parallel sides of said gate line;

a gate electrode formed on one end of said first opaque metal layer;

an insulating layer formed to cover said first opaque metal layer and said gate line;

a pixel electrode formed inside said first opaque metal layer and overlapping said insulating layer, wherein edge parts of said pixel electrode, said gate line, and said insulating layer form a storage capacitor therebetween; and a thin film transistor having a source electrode connected to said signal line, and having a drain electrode connected to said pixel electrode and said gate electrode.

2. The liquid crystal display device according to claim 1, further comprising:

a second opaque metal layer formed on edges of two sides of said gate line perpendicular to said first opaque metal layer.

3. A liquid crystal display device having a high aperture ratio, comprising:

a glass substrate;

a signal line formed on said glass substrate;

a gate line formed on said glass substrate, said gate line being a rectangular shaped layer having a plurality of sections removed, being adjacent to said signal line, and being made of a transparent conductive material;

a gate electrode formed on one end of said gate line;

an insulating layer formed to cover said gate line;

a pixel electrode overlapped on said insulating layer, said pixel electrode, said gate line, and said insulating layer forming a storage capacitor therebetween; and a thin film transistor having a source electrode connected to said signal line, and having a drain electrode connected to said pixel electrode and said gate electrode.

4. The liquid crystal display device according to claim 3, wherein:

said gate line forms one of a mesh structure and a ladder structure.

5. The liquid crystal display device according to claims 3 or 4, further comprising opaque metal layers formed on edges of two parallel sides of said gate line to increase a conductivity of said gate line.

6. The liquid crystal display device according to claim 5, further comprising a second opaque metal layer formed on edges of two sides of said gate line perpendicular to said opaque metal layers.

7. The liquid crystal display device according to claim 6, wherein:

said first opaque metal layer is made of a metal having a high melting point and a low resistance.

8. The liquid crystal display device according to claim 7, wherein said opaque metal layer is a metal selected from the group consisting of aluminum, tantalum and alloy of molybdenum and tantalum.

9. A liquid crystal display device having a high aperture ratio, comprising:

a glass substrate;

a gate line formed on said glass substrate;

a first opaque metal layer formed on said gate line, said first opaque metal layer increasing a conductivity of said gate line;

a gate electrode formed on one end of said gate line;

a signal line formed perpendicular to said gate line;

a transparent conductive material layer formed inside both said gate line and said signal line and connected to said gate line, said transparent conductive material layer being a rectangular shaped layer having a plurality of sections removed so as to form one of a mesh structure and a ladder structure;

an insulating layer formed to cover said transparent conductive material layer;

a pixel electrode overlapping said insulating layer, said pixel electrode, said transparent conductive material layer, and said insulating layer forming a storage capacitor therebetween; and a thin film transistor having a source electrode connected to said signal line, and having a drain electrode connected to said pixel electrode and said gate electrode.

10. The liquid crystal display device according to claim 1, 2, 3, 4 or 9, wherein:

said transparent conductive material comprises indium tin oxide.

11. The liquid crystal display device according to claim 1, 2 or 9, wherein:

said first opaque metal layer is made of a metal having a high melting point and a low resistance.

12. The liquid crystal display device according to claim 11, wherein said first opaque metal layer is a metal selected from a group consisting of:

aluminum;

tantalum; and alloy of molybdenum and tantalum.

* * * * *